United States Patent
Kinugawa et al.

(10) Patent No.: US 9,346,665 B2
(45) Date of Patent: May 24, 2016

(54) MEMS VIBRATOR, METHOD OF MANUFACTURING MEMS VIBRATOR, ELECTRONIC DEVICE, AND MOVING OBJECT

(71) Applicant: Seiko Epson Corporation, Tokyo (JP)

(72) Inventors: Takuya Kinugawa, Chino (JP); Akinori Yamada, Ina (JP)

(73) Assignee: Seiko Epson Corporation (JP)

( * ) Notice: Subject to any disclaimer, the term of this patent is extended or adjusted under 35 U.S.C. 154(b) by 45 days.

(21) Appl. No.: 14/191,884

(22) Filed: Feb. 27, 2014

(65) Prior Publication Data

US 2014/0246737 A1 Sep. 4, 2014

(30) Foreign Application Priority Data

Mar. 1, 2013 (JP) ................................. 2013-040408

(51) Int. Cl.
*H01L 29/84* (2006.01)
*B81B 3/00* (2006.01)
*G01P 15/097* (2006.01)

(52) U.S. Cl.
CPC ............. *B81B 3/0086* (2013.01); *G01P 15/097* (2013.01); *B81B 2201/0235* (2013.01); *B81B 2203/0118* (2013.01); *Y10T 29/49117* (2015.01)

(58) Field of Classification Search
CPC .......................... B81B 3/0018; B81C 1/00015
USPC .......................................................... 257/415
See application file for complete search history.

(56) References Cited

U.S. PATENT DOCUMENTS

| | | | |
|---|---|---|---|
| 6,437,965 B1* | 8/2002 | Adkins et al. | 361/303 |
| 2003/0168929 A1* | 9/2003 | Ma et al. | 310/309 |
| 2006/0181368 A1* | 8/2006 | Naniwada | 333/186 |
| 2007/0052497 A1* | 3/2007 | Tada | 333/186 |

FOREIGN PATENT DOCUMENTS

| | | |
|---|---|---|
| JP | 2012-085085 A | 4/2012 |
| JP | 2013-123779 A | 6/2013 |

* cited by examiner

*Primary Examiner* — Phat X Cao
*Assistant Examiner* — Mohammad M Hoque
(74) *Attorney, Agent, or Firm* — Harness, Dickey & Pierce, P.L.C.

(57) ABSTRACT

A MEMS vibrator includes an insulating portion, a first electrode provided on one surface of the insulating portion, a fixed portion, and a function portion, a second electrode provided so that at least a portion thereof overlaps the first electrode at a distance therefrom. The second electrode comes into contact with the function portion and extends from the fixed portion.

3 Claims, 12 Drawing Sheets

MEMS VIBRATOR, METHOD OF MANUFACTURING MEMS VIBRATOR, ELECTRONIC DEVICE, AND MOVING OBJECT

BACKGROUND

1. Technical Field

The present invention relates to a MEMS vibrator, a method of manufacturing a MEMS vibrator, an electronic device, and a moving object.

2. Related Art

Generally, electro-mechanical system structures (for example, vibrators, filters, acceleration sensors, motors, and the like) are known which include a mechanically displaceable structure called a MEMS (Micro Electro Mechanical System) device formed using a semiconductor micromachining technique. Among the structures, a MEMS vibrator is easily manufactured by incorporating a drive circuit of a vibrator or a circuit that amplifies a change of vibration, as compared with a vibrator and a resonator using a quartz crystal or a dielectric, and is advantageous to miniaturization and high functionality. Therefore, its applications are widespread.

As a representative example of the MEMS vibrator in the related art, a beam vibrator vibrating in the thickness direction of a substrate is known. The beam vibrator is a vibrator which is constituted by a lower electrode (fixed electrode) provided on the substrate, an upper electrode (movable electrode) provided at a distance from the lower electrode, and the like. As the beam vibrator, a clamped-free beam, a clamped-clamped beam, a free-free beam and the like are known depending on a method of supporting the movable electrode.

JP-A-2012-85085 discloses a MEMS vibrator having a structure in which a fixed portion extends from an insulating portion provided on a substrate in a direction intersecting the insulating portion, and a movable electrode further extends from a fixed portion in a direction intersecting the fixed portion.

However, since vibration leaking from the movable electrode between the movable electrode and the fixed portion which are provided in an intersection manner and between the fixed portion and the insulating portion which are provided in an intersection manner is refracted and propagated, there may be a concern of a reduction in a Q value of the MEMS vibrator or a fluctuation in the characteristics of a vibration frequency or the like due to distortion occurring from the vibration leaking at each of the intersection points between the movable electrode and the fixed portion and between the fixed portion and the insulating portion.

SUMMARY

An advantage of some aspects of the invention is to solve at least a part of the problems described above, and the invention can be implemented as the following forms or application examples.

Application Example 1

This application example is directed to a MEMS vibrator including: an insulating portion; a first electrode, a fixed portion, and a function portion which are provided on one surface of the insulating portion; and a second electrode which is provided so that at least a portion thereof overlaps the first electrode at a distance therefrom when seen in a plan view from a vertical direction to the one surface. The second electrode comes into contact with the function portion, and extends from the fixed portion.

According to such a MEMS vibrator, the second electrode as a movable electrode comes into contact with the function portion provided on one surface of the insulating portion and extends from the fixed portion. Thereby, vibration leaking from the second electrode is refracted in the function portion, and the leakage of the vibration to the fixed portion is suppressed. Thus, it is possible to suppress distortion occurring between the second electrode and the fixed portion and between the fixed portion and the insulating portion by the vibration leaking from the second electrode. Therefore, it is possible to suppress a shift in the vibration frequency of the second electrode occurring from the distortion and a reduction in a Q value of the MEMS vibrator.

Application Example 2

In the MEMS vibrator according to the application example described above, it is preferable that wiring extends on the one surface of the insulating portion from the fixed portion.

According to such a MEMS vibrator, the wiring extends from the fixed portion, and thus it is possible to easily output a signal by the vibration of the second electrode.

Application Example 3

In the MEMS vibrator according to the application example described above, it is preferable that the second electrode, the fixed portion, and the wiring contain the same material.

According to such a MEMS vibrator, the second electrode, the fixed portion, and the wiring contain the same material, and thus it is possible to increase conductivity therebetween, and to suppress a loss of a signal, output through the fixed portion and the wiring, by the vibration of the second electrode.

Application Example 4

This application example is directed to a method of manufacturing a MEMS vibrator including: forming an insulating portion; forming a first electrode, a fixed portion, and a function portion on one surface of the insulating portion; and forming a second electrode so that at least a portion thereof overlaps the first electrode at a distance therefrom when seen in a plan view from a vertical direction to the one surface. In the forming of the second electrode, the second electrode comes into contact with the function portion, and the second electrode is formed by stretching from the fixed portion.

According to such a method of manufacturing a MEMS vibrator, the forming of the function portion on one surface of the insulating portion is included, and the second electrode can be brought into contact with the function portion and be formed by the extension from the fixed portion.

Thereby, vibration leaking from the second electrode is refracted in the function portion, and the leakage of the vibration to the fixed portion is suppressed. Thus, it is possible to suppress distortion occurring between the second electrode and the fixed portion and between the fixed portion and the insulating portion by the vibration leaking from the second electrode. Therefore, it is possible to manufacture a MEMS vibration element in which a shift in the vibration frequency of the second electrode occurring from the distortion and a reduction in a Q value of the MEMS vibrator are suppressed.

Application Example 5

This application example is directed to a MEMS vibrator including: an insulating portion; a first electrode, a fixed portion, and a function portion which are provided on one surface of the insulating portion; and a second electrode which is provided so that at least a portion thereof overlaps the first electrode at a distance therefrom when seen in a plan view from a vertical direction to the one surface. The second electrode is provided with a beam portion, and the beam portion comes into contact with the function portion and extends from the second electrode toward the fixed portion.

According to such a MEMS vibrator, the beam portion extending from the second electrode as a movable electrode toward the fixed portion is provided by contacting the function portion provided on one surface of the insulating portion. Thereby, the vibration leaking from the second electrode to the beam portion is refracted in the function portion, and the leakage of the vibration to the fixed portion is suppressed. Thus, it is possible to suppress distortion occurring between the beam portion and the fixed portion and between the fixed portion and the insulating portion by the vibration leaking from the second electrode. Therefore, it is possible to suppress a shift in the vibration frequency of the second electrode occurring from the distortion and a reduction in a Q value of the MEMS vibrator.

Application Example 6

This application example is directed to a method of manufacturing a MEMS vibrator including: forming an insulating portion; forming a first electrode, a fixed portion, and a function portion on one surface of the insulating portion; and forming a second electrode so that at least a portion thereof overlaps the first electrode at a distance therefrom when seen in a plan view from a vertical direction to the one surface. In the forming of the second electrode, a beam portion stretching from the second electrode toward the fixed portion is formed by contacting the function portion.

According to such a method of manufacturing a MEMS vibrator, the beam portion extending from the second electrode as a movable electrode toward the fixed portion can be formed by contacting the function portion provided on one surface of the insulating portion.

Thereby, the vibration leaking from the second electrode to the beam portion is refracted in the function portion, and the leakage of the vibration to the fixed portion is suppressed. Thus, it is possible to suppress distortion occurring between the beam portion and the fixed portion and between the fixed portion and the insulating portion by the vibration leaking from the second electrode. Therefore, it is possible to manufacture a MEMS vibration element in which a shift in the vibration frequency of the second electrode occurring from the distortion and a reduction in a Q value of the MEMS vibrator are suppressed.

Application Example 7

This application example is directed to an electronic device to which the MEMS vibrator described above is mounted.

According to such an electronic device, the MEMS vibrator is mounted, and thus it is possible to obtain an electronic device having high-accuracy reliability in which a shift in vibration frequency and a reduction in a Q value of the MEMS vibrator are suppressed.

Application Example 8

This application example is directed to a moving object to which the MEMS vibrator described above is mounted.

According to such a moving object, the MEMS vibrator is mounted, and thus it is possible to obtain a moving object having high reliability in which a shift in vibration frequency and a reduction in a Q value of the MEMS vibrator are suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings. Meanwhile, in each drawing shown below, respective components are set to have sizes which are capable of being recognized on the drawings, and thus the dimensions and ratios of the respective components may be described appropriately different from those of the actual components.

First Embodiment

A MEMS vibrator according to a first embodiment will be described with reference to FIGS. 1 to 5.

Figure 1:
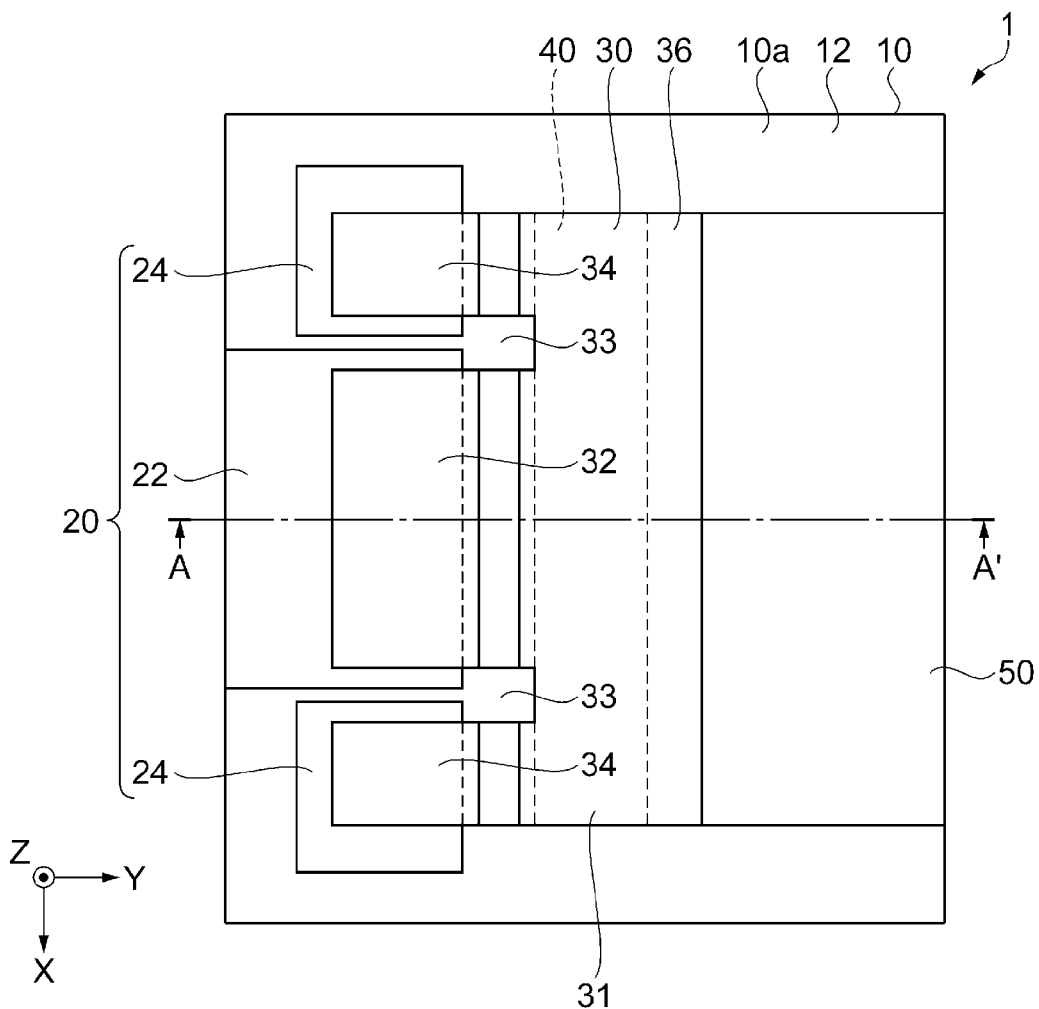
FIG. 1 is a plan view schematically illustrating a MEMS vibrator according to a first embodiment.
Figure 2:
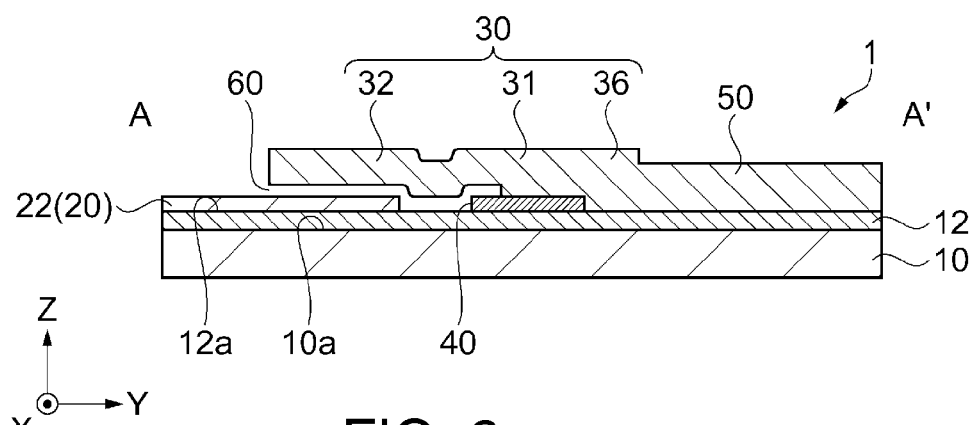
FIG. 2 is a cross-sectional view schematically illustrating the MEMS vibrator according to the first embodiment.

FIG. 1 is a plan view schematically illustrating an outline of the MEMS vibrator according to the first embodiment. FIG. 2 is a cross-sectional view schematically illustrating a cross-section of the MEMS vibrator taken along line A-A' of FIG. 1.

Figure 3:
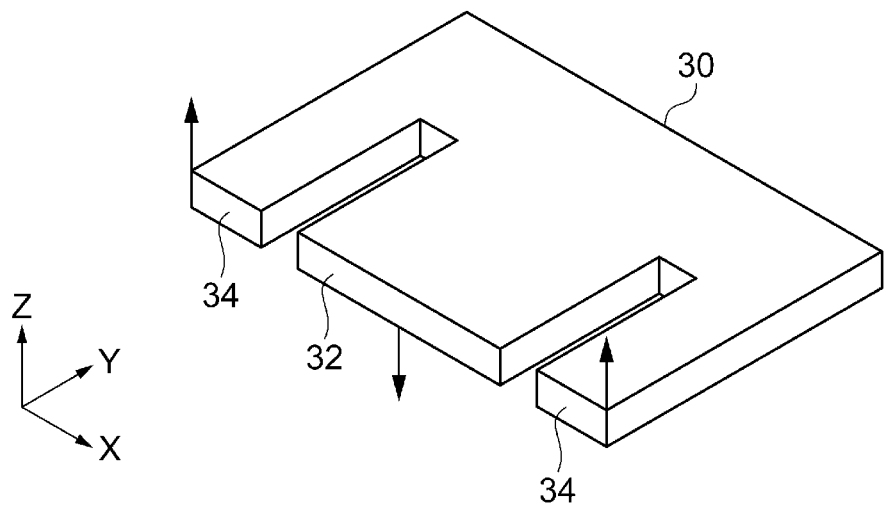
FIG. 3 is a perspective view schematically illustrating an operation of the MEMS vibrator according to the first embodiment.
Figure 4:
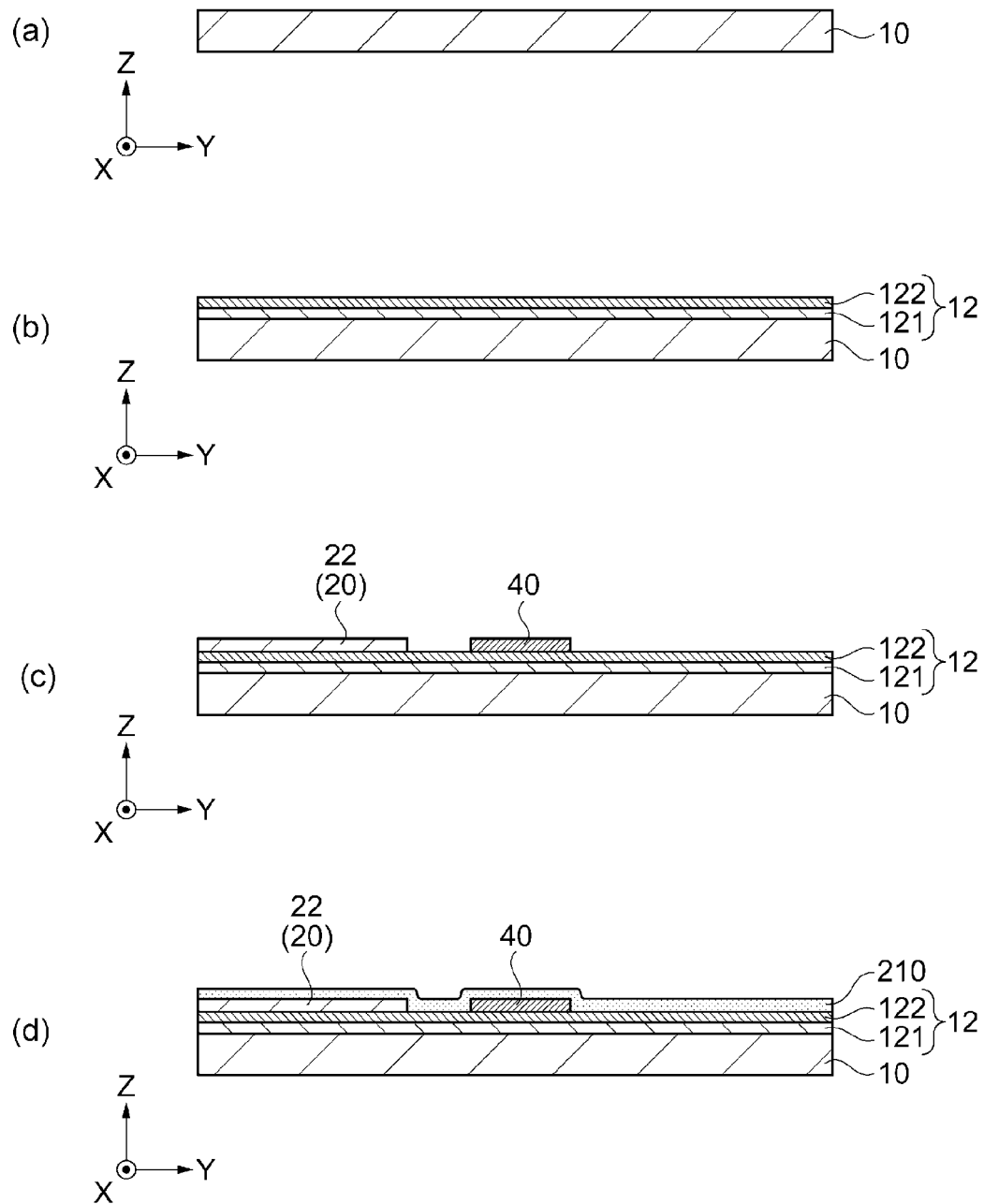
FIGS. 4A to 4D are cross-sectional views schematically illustrating a process of manufacturing the MEMS vibrator according to the first embodiment.
Figure 5:
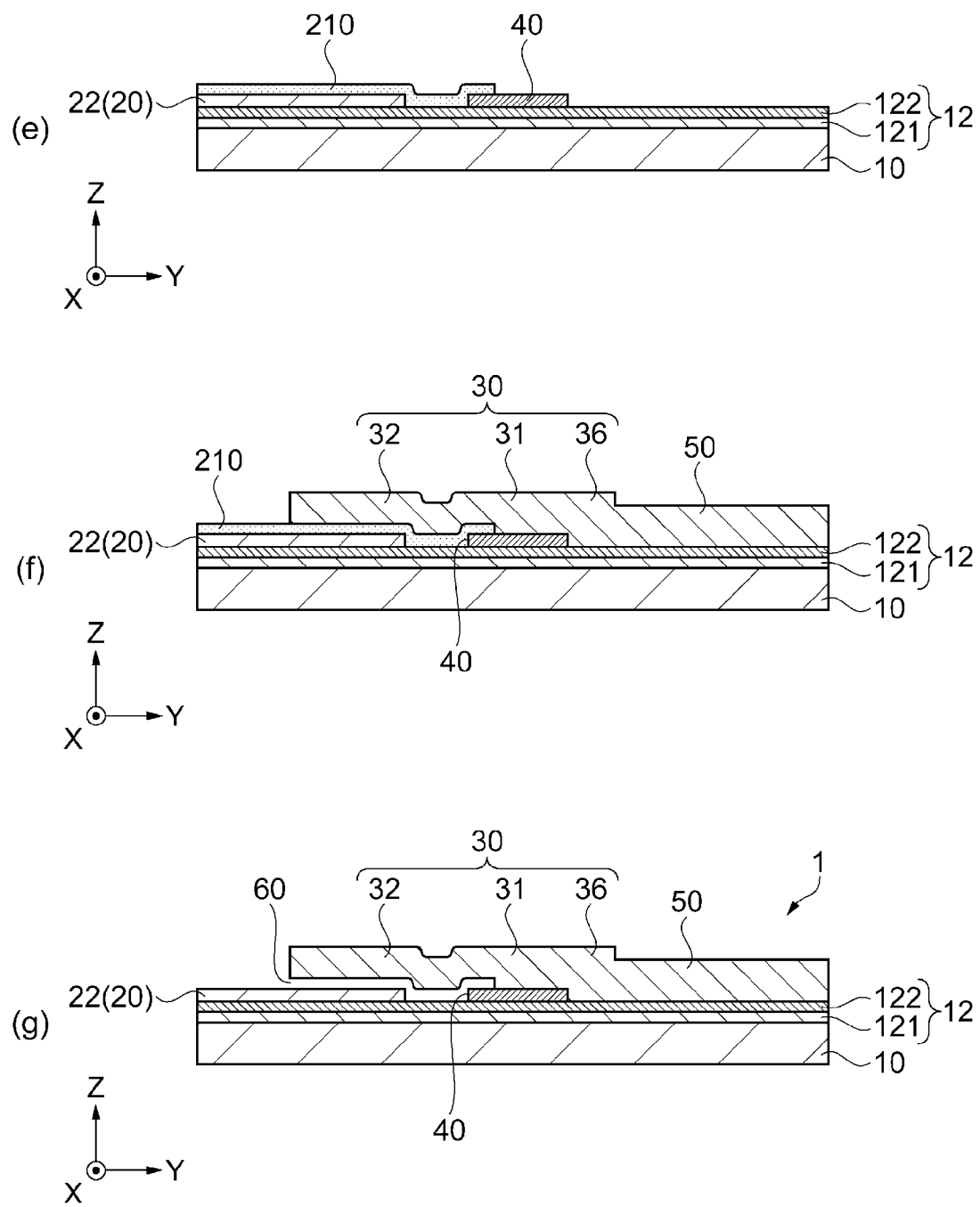
FIGS. 5E to 5G are cross-sectional views schematically illustrating a process of manufacturing the MEMS vibrator according to the first embodiment.

FIG. 3 is a perspective view illustrating an operation of the MEMS vibrator. FIGS. 4A to 5G are diagrams schematically illustrating the cross-section of the MEMS vibrator taken along line A-A' of FIG. 1, and cross-sectional views illustrating a process of manufacturing the same.

In addition, FIGS. 1 to 5 illustrate an X axis, a Y axis, and a Z axis as three axes which are at right angles to each other. Meanwhile, the Z axis is an axis indicating a thickness direction in which each electrode is laminated on a substrate.

Structure of MEMS Vibrator 1

A MEMS vibrator 1 according to the first embodiment is a MEMS vibrator of a so-called clamped-free beam.

As shown in FIGS. 1 and 2, the MEMS vibrator 1 is provided with a substrate 10, a lower electrode 20 (fixed electrode) as a first electrode, an upper electrode 30 (movable electrode) as a second electrode, a function portion 40, and a wiring portion 50.

Substrate 10

The substrate 10 has a principal surface 10a which is provided with an insulating portion 12 described later, the lower electrode 20, the upper electrode 30, the function portion 40, the wiring portion 50, and the like. In the substrate 10, for example, a silicon substrate, a glass substrate or the like can be used as a material thereof. In the MEMS vibrator 1 of the embodiment, a silicon substrate is used as the substrate 10.

When called the principal surface 10a side in the following description, it is described as one surface which is provided with the insulating portion 12 and the like.

Insulating Portion 12

The insulating portion 12 is provided by lamination on the principal surface 10a of the substrate 10.

The insulating portion 12 is constituted by a first insulating portion 121 and a second insulating portion 122 which are arranged in this order from the principal surface 10a side. As a material of the first insulating portion 121, a silicon oxide ($SiO_2$) or the like can be used. In addition, as a material of the second insulating portion 122, a silicon nitride ($Si_3N_4$) or the like can be used. The configuration and material of the insulating portion 12 are not particularly limited, but may be appropriately changed insofar as insulation performance between the substrate 10 and the lower electrode 20 or the like described later can be secured. In addition, the configuration and material of the insulating portion 12 may be appropriately changed insofar as the substrate 10 can be protected at the time of forming the upper electrode 30 or the like described later, and the aforementioned insulation performance can be secured.

When called the principal surface 12a side in the following description, it is described as one surface which is provided with the second insulating portion 122 of the insulating portion 12.

The lower electrode 20, the upper electrode 30, the function portion 40, and the wiring portion 50 are provided on the substrate 10 of the MEMS vibrator 1 with the principal surface 12a of the insulating portion 12 interposed therebetween.

Upper Electrode 30, Fixed Portion 36, and Wiring Portion 50

A fixed portion 36 extends from the insulating portion 12 in a direction intersecting the principal surface 12a. The wiring portion 50 extends from one end of fixed portion 36 on the insulating portion 12 side along the principal surface 12a. The upper electrode 30 extends from the other end on the opposite side to one end provided with the wiring portion 50 in a direction intersecting the fixed portion 36.

The upper electrode 30 is provided with a base 31, a first arm portion 32, and second arm portions 34.

The first arm portion 32 extends from the base 31. The second arm portions 34 extend from the base 31 and are provided side by side at a distance 33 from the first arm portion 32.

As a material of which the upper electrode 30 is formed, polycrystalline silicon or amorphous silicon can be used. Since polycrystalline silicon has generally conductivity, the upper electrode 30 can obtain a function as an electrode without providing an electrode film or the like.

In addition, as materials of the fixed portion 36 and the wiring portion 50, it is also preferable to use polycrystalline silicon, amorphous silicon or the like. The same material is used as materials of the upper electrode 30, the fixed portion 36, and the wiring portion 50, and thus it is possible to integrally form the electrode and these portions, and to suppress electric resistance associated with the interconnection of the upper electrode 30, the fixed portion 36, and the wiring portion 50. In addition, the same material is used as materials of the upper electrode 30, the fixed portion 36, and the wiring portion 50, and thus stress due to a temperature change occurs uniformly. Therefore, it is possible to suppress the characteristic fluctuation of the MEMS vibrator 1.

Lower Electrode 20

The lower electrode 20 is provided with a first electrode 22 and a second electrode 24.

As shown in FIG. 1, when the lower electrode 20 and the upper electrode 30 are seen in a plan view from a Z-axis direction, the lower electrode 20 is provided on the insulating portion 12 (on the principal surface 12a) so that at least a portion of the first electrode 22 and the first arm portion 32 of the upper electrode 30 overlap each other. In addition, the lower electrode 20 is provided on the insulating portion 12 (on the principal surface 12a) so that at least a portion of the second electrode 24 and the second arm portion 34 of the upper electrode 30 overlap each other.

Meanwhile, when the lower electrode 20 and the upper electrode 30 are seen in a plan view, the lower electrode 20 is provided on the insulating portion 12 (principal surface 12a side) so that the second electrode 24 and the first arm portion 32, and the first electrode 22 and the second arm portion 34 do not overlap each other. In addition, the first electrode 22 and the second electrode 24 are electrically isolated from each other.

As a material of the lower electrode 20, for example, polycrystalline silicon, amorphous silicon, gold (Au), titanium (Ti), or an alloy containing these materials can be used.

Function Portion 40

The function portion 40 is provided on the principal surface 12a of the insulating portion 12 in connection with the fixed portion 36.

The function portion 40 is provided with the upper electrode 30 extending from the fixed portion 36 so as to come into contact therewith. Specifically, the base 31 of the upper electrode 30 extending from the fixed portion 36 is provided so as to come into contact with the function portion 40.

Thereby, when the vibration of the upper electrode 30 leaks, it is possible to suppress the refraction of vibration in the function portion 40 and the transmission thereof to the fixed portion 36.

As the material of the function portion 40, the same material as those of the upper electrode 30 and the wiring portion 50 is preferably used. For example, polycrystalline silicon, amorphous silicon or the like can be used. In addition, the function portion 40 preferably has a physical constant of a material equal to that of the upper electrode 30.

In the function portion 40, the same material having a physical constant equal to those of the upper electrode 30 and the wiring portion 50 is used, and thus stress associated with a temperature change is equally generated in the upper electrode 30 and the fixed portion 36. Therefore, it is possible to increase adhesion to the upper electrode 30.

Operation of MEMS Vibrator 1

The MEMS vibrator 1 of the embodiment can supply (transmit) a drive signal generated in a circuit portion (not shown) to the lower electrode 20 and the upper electrode 30. Meanwhile, the supply (transmission) of the drive signal to the upper electrode 30 can be performed through the fixed portion 36 and the wiring portion 50 extending from the fixed portion 36. In addition, an electric signal obtained by the vibration of the upper electrode 30 can be extracted through the lower electrode 20, and the fixed portion 36 and the wiring portion 50 which are connected to the upper electrode 30.

The first arm portion 32 and the second arm portion 34 can be alternately vibrated up and down by supplying the drive signal to the lower electrode 20 and the upper electrode 30.

Specifically, a voltage, for example, having an opposite phase is applied between the second arm portion 34 of the upper electrode 30 and the second electrode 24 of the lower electrode 20. Alternatively, a short-circuit between the second arm portion 34 of the upper electrode 30 and the second electrode 24 of the lower electrode 20 is performed, and thus a voltage may not be applied. Alternatively, the second electrode 24 of the lower electrode 20 may be in a floating state.

Therefore, as shown by arrows in FIG. 3, the vibration direction of the first arm portion 32 and the vibration direction of the second arm portion 34 are opposite to each other, and the first arm portion 32 and the second arm portion 34 alternately move up and down by charges generated by the application of the drive signal. In this manner, the upper electrode 30 is formed as a three-arm structure, and thus it is possible to increase a Q value even in a vibrational mode using up-and-down movement which is, for example, a Z-axis direction shown in FIG. 3.

Method of Manufacturing MEMS Vibrator 1

A process of manufacturing the MEMS vibrator 1 of the embodiment includes a process of preparing the substrate 10 having the principal surface 10a on which the insulating portion 12, the lower electrode 20, the upper electrode 30, and the like are formed. In addition, the process of manufacturing the MEMS vibrator 1 includes a process of forming the insulating portion 12 on the principal surface 10a side of the substrate 10, a process of forming the lower electrode 20 on the principal surface 12a of the insulating portion 12, a process of forming the function portion 40, and a process of forming the upper electrode 30 at a distance 60 from the lower electrode 20.

Hereinafter, a method of manufacturing the MEMS vibrator 1 in order of processes will be described with reference to FIGS. 4A to 5G. Meanwhile, each drawing shown in FIGS. 4A to 5G illustrates a state in the cross-section taken along line A-A' of FIG. 1.

Process of Preparing Substrate 10

FIG. 4A illustrates a state in which the substrate 10 for forming the MEMS vibrator 1 is prepared.

A process of preparing the substrate 10 is a process of preparing the substrate 10 on which the insulating portion 12, the lower electrode 20, the upper electrode 30, and the like are formed in each process described later. As the substrate 10, for example, a silicon substrate can be used. Meanwhile, in the description of the method of manufacturing the MEMS vibrator 1, one surface of the substrate 10 on the side where the insulating portion 12, the lower electrode 20, the upper electrode 30, and the like are formed is also called the principal surface 10a.

Process of Forming Insulating Portion 12

FIG. 4B illustrates a state in which the insulating portion 12 is formed on the principal surface 10a of the substrate 10.

A process of forming the insulating portion 12 is a process of forming the insulating portion 12 on the principal surface 10a side of the substrate 10 prepared in the above-mentioned process.

The insulating portion 12 of the MEMS vibrator 1 according to the embodiment is constituted by the first insulating portion 121 and the second insulating portion 122 in this order from the principal surface 10a side of the substrate 10. Meanwhile, in the description of the method of manufacturing the MEMS vibrator 1, one surface of the insulating portion 12 on the side where the second insulating portion 122 is formed is also called the principal surface 12a.

In a process of forming the first insulating portion 121, an silicon oxide ($SiO_2$) film can be formed as, for example, the first insulating portion 121 by a CVD (chemical vapor deposition) method. The process of forming the first insulating portion 121 is not limited to the CVD method, and a silicon oxide film may be formed on the principal surface 10a of a silicon substrate as the substrate 10 by a thermal oxidation method.

Meanwhile, the first insulating portion 121 corresponds to the principal surface 10a of the substrate 10, and is formed on substantially the entire surface thereof.

In a process of forming the second insulating portion 122, a silicon nitride ($Si_3N_4$) film, for example, as the second insulating portion 122 can be formed by a CVD method. The process of forming the second insulating portion 122 is not limited to the CVD method, and a silicon nitride film may be formed by heating a silicon substrate as the substrate 10 in the atmosphere of a nitrogen gas and a hydrogen gas.

Meanwhile, the second insulating portion 122 corresponds to the first insulating portion 121, and is formed on substantially the entire surface thereof.

Process of Forming Lower Electrode 20

FIG. 4C illustrates a state in which the lower electrode 20 and the function portion 40 are formed on the principal surface 12a of the insulating portion 12.

A process of forming the lower electrode 20 is a process of forming the lower electrode 20 on the principal surface 12a side of the above-mentioned insulating portion 12, that is, the second insulating portion 122.

In the process of forming the lower electrode 20, the first electrode 22 and the second electrode 24 containing conductive materials such as, for example, polycrystalline silicon, amorphous silicon, gold (Au), and titanium (Ti) can be formed by a CVD (Chemical Vapor Deposition) method.

Meanwhile, in order to form the function portion 40 on the second insulating portion 122, in addition to the lower electrode 20, in a process described later, a mask is performed on a portion (region) located on the second insulating portion 122 in which it is not desired to form the lower electrode 20, and the lower electrode 20 is formed. Thereby, it is possible to form the lower electrode 20 including the first electrode 22 and the second electrode 24 which are electrically isolated from each other. In addition, the lower electrode 20 may be formed by patterning using a photolithographic method.

A method of forming the lower electrode 20 is not limited to a CVD method, and the lower electrode 20 containing various types of conductive materials may be formed using a PVD (Physical Vapor Deposition) method or the like.

Process of Forming Function Portion 40

A process of forming the function portion 40 is a process of forming the function portion 40 on the principal surface 12a side of the above-mentioned insulating portion 12, that is, the second insulating portion 122.

In the process of forming the function portion 40, the function portion 40 containing an insulating material such as, for example, a silicon nitride can be formed by a CVD method.

Meanwhile, in order to form the above-mentioned lower electrode 20 on the second insulating portion 122 in addition to the function portion 40, a mask is performed on a portion (region) located on the second insulating portion 122 in which it is not desired to form the function portion 40, and the function portion 40 is formed. In addition, the function portion 40 may be formed by patterning using a photolithographic method. A method of forming the function portion 40 is not limited to a CVD method, and the function portion 40 may be formed using a PVD method or the like.

Process of Forming Sacrificial Layer 210

FIG. 4D illustrates a state in which a sacrificial layer 210 for providing the distance 60 between the lower electrode 20 and the upper electrode 30 is provided so as to cover the lower electrode 20 and the function portion 40.

A process of forming the sacrificial layer 210 is a process of forming the sacrificial layer 210 which is an intermediate layer for providing the distance 60 between the lower electrode 20 and the upper electrode 30.

As mentioned above, the MEMS vibrator 1 is provided with the upper electrode 30 at the distance 60 from the lower electrode 20. The upper electrode 30 is formed on the sacrificial layer 210 in a process described later, and the sacrificial layer 210 is removed after the formation of the upper electrode 30, thereby allowing the distance 60 to be provided between the lower electrode 20 and the upper electrode.

In the process of forming the sacrificial layer 210, the sacrificial layer 210 containing, for example, a silicon oxide can be formed by a CVD method. A method of forming the sacrificial layer 210 is not limited to a CVD method, and the sacrificial layer 210 containing a silicon oxide may be formed using a PVD method or the like.

Meanwhile, the sacrificial layer 210 is removed while the lower electrode 20, the upper electrode 30, and the function portion 40 are left behind in a process described later. Thus, as a material constituting the sacrificial layer 210, a silicon oxide capable of selectively removing (etching) the sacrificial layer 210, or a compound containing the silicon oxide is suitable.

The material of the sacrificial layer 210 is not limited to a silicon oxide, or a compound containing the silicon oxide, and may be appropriately changed insofar as a material capable of selectively removing the sacrificial layer 210 is used.

FIG. 5E illustrates a state in which the sacrificial layer 210 of a portion where the upper electrode 30 and the function portion 40 come into contact with each other and a portion provided with the fixed portion 36 and the wiring portion 50 is partially removed.

A process of partially removing the sacrificial layer 210 is a process of removing the sacrificial layer 210 which is formed on the portion where the upper electrode 30 (base 31) and the function portion 40 come into contact with each other and the portion having the fixed portion 36 and the insulating portion 12 being formed thereon by a photolithographic method.

In the process of removing the sacrificial layer 210, the sacrificial layer 210 is removed so that the function portion 40 brought into contact with the base 31 and the insulating portion 12 on which the fixed portion 36 and the wiring portion 50 are formed are exposed.

Process of Forming Upper Electrode 30

FIG. 5F illustrates a state in which the upper electrode 30 is formed on the principal surface 12a (principal surface 10a) with the sacrificial layer 210 interposed therebetween.

A process of forming the upper electrode 30 is a process of forming the upper electrode 30 on the principal surface 12a with the sacrificial layer 210 interposed therebetween. In addition, the process of forming the upper electrode 30 is a process of forming the wiring portion 50, stretching from the fixed portion 36 of the upper electrode 30, on the portion where the sacrificial layer 210 is removed in the aforementioned process.

In the process of forming the upper electrode 30, the upper electrode 30, the fixed portion 36, and the wiring portion 50 can be formed on the insulating portion 12 by a CVD method using a conductive material such as, for example, polycrystalline silicon or amorphous silicon.

In addition, in the process of forming the upper electrode 30, a layer serving as the upper electrode 30 containing a conductive material such as, for example, polycrystalline silicon or amorphous silicon formed in the process is formed, and the first arm portion 32, the second arm portion 34, the fixed portion 36, the wiring portion 50, and the like are formed by patterning the layer, containing a conductive material, serving as the formed upper electrode 30 by a photolithographic method.

Meanwhile, a method of forming the upper electrode 30 is not limited to a CVD method, and the upper electrode 30, the fixed portion 36, and the wiring portion 50 which contain various types of conductive materials may be formed using a PVD method or the like. In addition, in the process of forming the upper electrode 30, for example, a mask pattern is performed where a portion in which it is desired to form the upper electrode 30 on the sacrificial layer 210 is opened, and thus a layer serving as the upper electrode 30 may be formed using a CVD method, a PVD method, or the like.

Process of Removing Sacrificial Layer 210

FIG. 5G illustrates a state in which the sacrificial layer 210 formed in the above-mentioned process is removed.

A process of removing the sacrificial layer 210 is a process of selectively removing the sacrificial layer 210 formed in the previous process.

The process of removing the sacrificial layer 210 is required to selectively remove the sacrificial layer 210. Consequently, in the process of removing the sacrificial layer 210, the sacrificial layer 210 is etched (removed) by, for example, a wet etching method. The removal of the sacrificial layer 210 by a wet etching method is preferable when an etchant (cleaning solution) containing a hydrofluoric acid is used. By using the etchant containing a hydrofluoric acid, the etching rate of the sacrificial layer 210 containing a silicon oxide is higher than the etching rate of the lower electrode and the upper electrode 30 containing polycrystalline silicon, amorphous silicon, gold (Au) or the like, and thus the sacrificial layer 210 can be selectively and efficiently removed.

In addition, the second insulating portion 122 can function as a so-called etching stopper by containing a silicon nitride having hydrofluoric acid resistance in the second insulating portion 122 as an underlying film of the lower electrode 20, the fixed portion 36, the function portion 40, and the wiring portion 50. Thereby, in the MEMS vibrator 1, it is possible to suppress a reduction in insulation between the substrate 10 by the etching of the sacrificial layer 210, and the lower electrode 20, the fixed portion 36, the function portion 40, and the wiring portion 50.

Meanwhile, the process of removing the sacrificial layer 210 is not limited to a wet etching method, but may be performed by a dry etching method.

In the MEMS vibrator 1, the distance 60 occurs between the lower electrode 20 and the upper electrode 30 by the removal of the sacrificial layer 210, and thus the upper electrode 30 can vibrate.

The process of manufacturing the MEMS vibrator 1 is completed by removing the above-mentioned sacrificial layer 210.

According to the above-mentioned first embodiment, the following effects are obtained.

According to such a MEMS vibrator 1, the vibration leaking from the upper electrode 30 is refracted in the function portion 40, and the leakage of the vibration to the fixed portion 36 is suppressed. Thus, distortion occurring between the upper electrode 30 and the fixed portion 36 and between the fixed portion 36 and the insulating portion 12 due to the vibration leaking from the upper electrode 30 is suppressed. Therefore, it is possible to suppress a shift in the vibration frequency of the upper electrode 30 occurring from the distortion and a reduction in the Q value of the MEMS vibrator 1.

In addition, the upper electrode 30, the fixed portion 36, and the wiring portion 50 are formed by the same member, and thus it is possible to increase conductivity, and to suppress a loss of a signal, output through the fixed portion 36 and the wiring portion 50, due to the vibration of the upper electrode 30.

In addition, since the upper electrode 30 (base 31) extends from the fixed portion 36 so as to come into contact with the function portion 40, it is possible to provide the upper electrode 30 and the fixed portion 36 in connection with each other horizontally (in a Y-axis direction). Thus, it is possible to suppress an unnecessary vibrational mode as compared with a case where the upper electrode 30 and the fixed portion 36 are refracted and connected to each other.

Second Embodiment

A MEMS vibrator according to a second embodiment will be described with reference to FIGS. 6A to 10I.

Figure 6A:
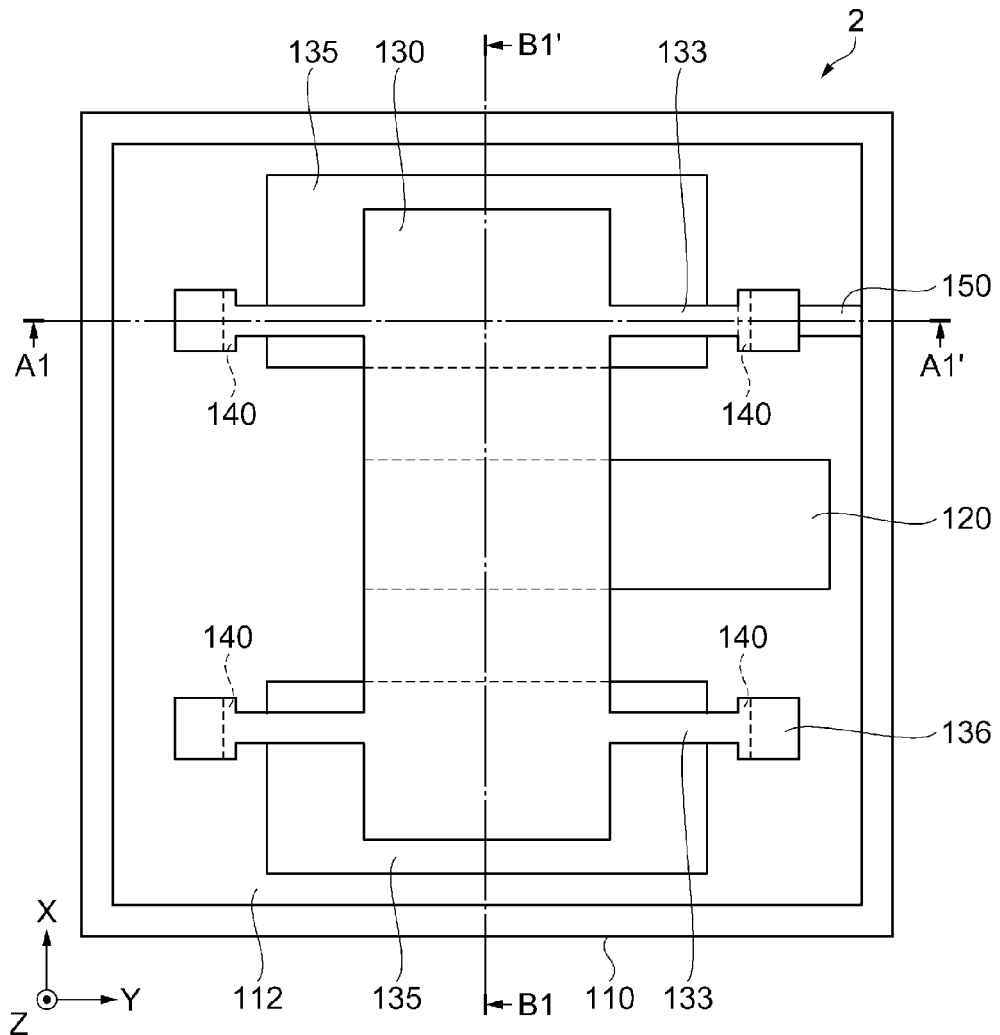
FIGS. 6A and 6B are plan and cross-sectional views schematically illustrating a MEMS vibrator according to a second embodiment.
Figure 6B:
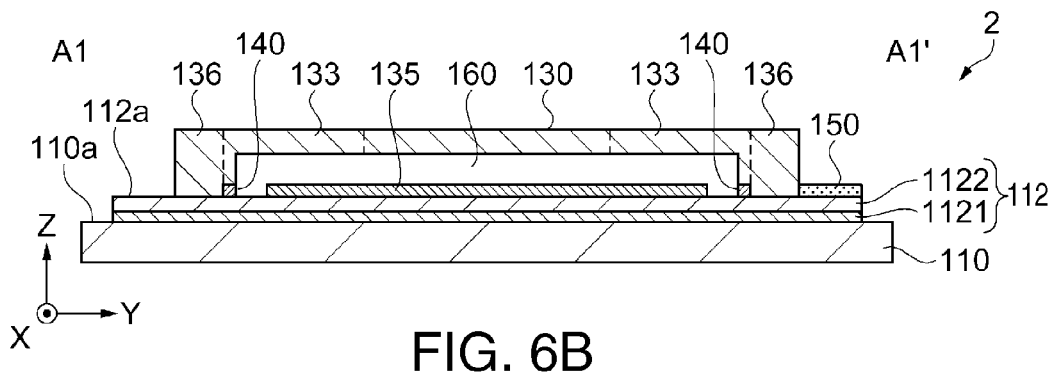
Figure 7:
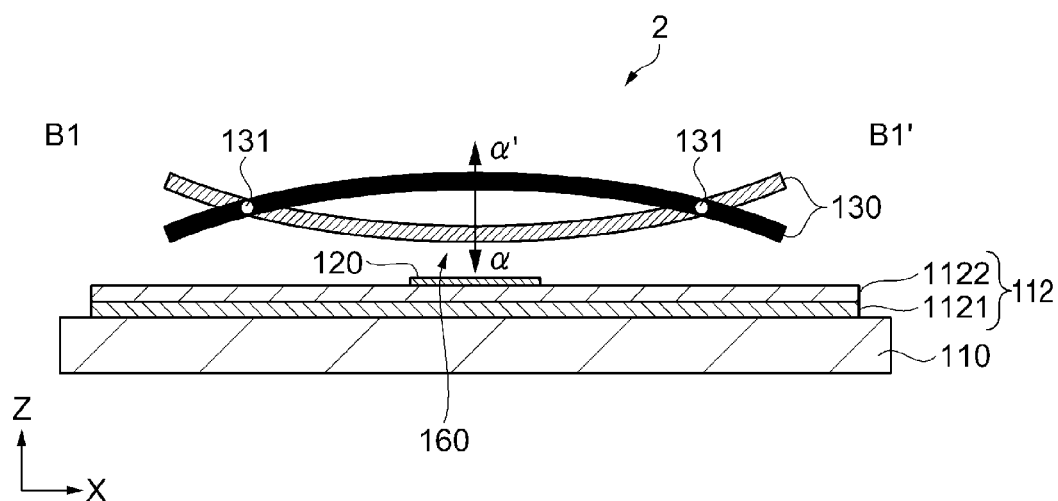
FIG. 7 is a cross-sectional view schematically illustrating an operation of the MEMS vibrator according to the second embodiment.

FIGS. 6A and 6B are a plan view and a cross-sectional view, respectively, schematically illustrating the MEMS vibrator according to the second embodiment. FIG. 7 is a cross-sectional view of the MEMS vibrator illustrating an operation of the MEMS vibrator according to the second embodiment. FIGS. 8A to 10I are diagrams schematically illustrating a cross-section of the MEMS vibrator taken along line A1-A1' of FIG. 6A, and are cross-sectional views illustrating a process of manufacturing a MEMS vibration element of the embodiment.

In addition, FIGS. 6A to 10I illustrate an X axis, a Y axis, and a Z axis as three axes which are at right angles to each other. Meanwhile, the Z axis is an axis indicating a thickness direction in which the substrate and each electrode are laminated.

Structure of MEMS Vibrator 2

A MEMS vibrator 2 according to the second embodiment is a MEMS vibrator of a so-called free-free beam.

As shown in FIGS. 6A and 6B, the MEMS vibrator 2 is provided with a substrate 110, a lower electrode 120 (fixed electrode) as a first electrode, an upper electrode 130 (movable electrode) as a second electrode, and function portions 140. In addition, the upper electrode 130 is provided with a beam portion 133 extending from the upper electrode 130, and a fixed portion 136 connected to the beam portion 133. In addition, the MEMS vibrator 2 is provided with the function portions 140 which come into contact with an insulating portion 112 and the beam portion 133. Meanwhile, as shown in FIGS. 6A and 6B, the MEMS vibrator 2 of the embodiment is configured such that a plurality of beam portions 133 extend from the upper electrode 130, and a wiring portion 150 is provided to one beam portion.

Substrate 110

The substrate 110 has a principal surface 110a provided with the insulating portion 112, the lower electrode 120, the upper electrode 130 and the like which are described later. As a material of the substrate 110, for example, a silicon substrate, a glass substrate or the like can be used. In the MEMS vibrator 2 of the embodiment, a silicon substrate is used as the substrate 110.

When called the principal surface 110a side in the following description, it is described as one surface provided with the insulating portion 112 and the like described later.

Insulating Portion 112

The insulating portion 112 is provided by lamination on the principal surface 110a of the substrate 110.

The insulating portion 112 is constituted by, for example, a first insulating portion 1121 and a second insulating portion 1122 which are arranged in this order from the principal surface 110a side. As a material of the first insulating portion 1121, a silicon oxide ($SiO_2$) or the like can be used. In addition, as a material of the second insulating portion 1122, a silicon nitride ($Si_3N_4$) or the like can be used. The configuration and material of the insulating portion 112 may be appropriately changed insofar as insulation performance between the substrate 110 and the lower electrode 120 or the like described later can be secured. In addition, the configuration and material of the insulating portion 112 are not particularly limited, but may be appropriately changed insofar as the substrate 110 can be protected at the time of forming the upper electrode 130 or the like described later, and the aforementioned insulation performance can be secured.

When called the principal surface 112a side in the following description, it is described as one surface provided with the second insulating portion 1122 of the insulating portion 112.

Lower Electrode 120, Conductive Portion 135, and Function Portion 140

The lower electrode 120, a conductive portion 135, and the function portion 140 are provided on the substrate 110 with the principal surface 112a of the insulating portion 112 interposed therebetween.

The lower electrode 120 is, for example, an electrode patterned in a rectangular shape, and conductive materials such as polycrystalline silicon, amorphous silicon (amorphous silicon), gold (Au), and titanium (Ti) are used as a material thereof.

The conductive portion 135 is, for example, an electrode patterned in a rectangular shape, and conductive materials such as polycrystalline silicon, amorphous silicon, gold (Au), and titanium (Ti) are used as a material thereof. The conductive portion 135 suppresses the occurrence of unevenness on the surface of the upper electrode 130 facing the lower electrode 120 at the time of forming the upper electrode 130 described later, and is provided in order for the MEMS vibrator 2 to obtain a desired vibration mode. In addition, the conductive portion 135 is preferably provided so as to have substantially the same thickness as that of the lower electrode 120 using a conductive material in order not to influence charges occurring between the lower electrode 120 and the upper electrode 130. Meanwhile, the conductive portion 135 is provided so as to have substantially the same thickness as that of the lower electrode 120, and an insulating material may be used as a material thereof in the case of not influencing charges occurring between the lower electrode 120 and the upper electrode 130.

Upper Electrode 130, Beam Portion 133, and Fixed Portion 136

The upper electrode 130 is provided on the substrate 110 at a distance 160 with the insulating portion 112 interposed therebetween. In addition, the upper electrode 130 is connected to the fixed portion 136 by the beam portion 133 extending from the upper electrode 130 and is fixed to the substrate 110.

The beam portion 133 extends from the upper electrode 130 toward the fixed portion 136, and is connected to the fixed portion 136. The fixed portion 136 extends toward the insulating portion 112 in a direction intersecting the beam portion 133 and is connected to the conductive portion 135.

The upper electrode 130 is, for example, patterned in a rectangular shape, has conductivity, and functions as a movable electrode. As a material of the upper electrode 130, for example, polycrystalline silicon or amorphous silicon (amorphous silicon) can be used. In addition, as materials of the beam portion 133 and the fixed portion 136, for example, polycrystalline silicon or amorphous silicon can be used similarly to the upper electrode 130.

Function Portion 140

The function portion 140 is provided on the substrate 110 with the principal surface 112a interposed therebetween.

As shown in FIG. 6B, the function portion 140 is provided so as to come into contact with the beam portion 133.

When the vibration of the upper electrode 130 leaks to the beam portion 133, the function portion 140 is provided in order to suppress the transmission of the vibration to the fixed portion 136. As a material of the function portion 140, polycrystalline silicon, amorphous silicon, or the like can be used. In the embodiment, polycrystalline silicon is used as a material of the function portion 140.

Wiring Portion 150

The wiring portion 150 extends to be connected to one of the fixed portions 136 provided on the ends of the beam portions 133 extending from the upper electrode 130.

The wiring portion 150 is used in order to extract an electric signal associated with the vibration of the upper electrode 130, and conductive materials such as, for example, polycrystalline silicon, amorphous silicon, gold (Au), and aluminum (Al) are used as a material thereof. Meanwhile, when the wiring portion 150 is connected to any one of the fixed portions 136, the wiring portion 150 may extend from a plurality of fixed portions 136.

Operation of MEMS Vibrator 2

FIG. 7 is a cross-sectional view of the MEMS vibrator taken along line B1-B1' of FIG. 6A, and is a diagram illustrating a vibration operation of the upper electrode 130.

The MEMS vibrator 2 of the embodiment can supply (transmit) a drive signal generated in a circuit portion (not shown) to the lower electrode 120 and the upper electrode 130. Meanwhile, the supply (transmission) of the drive signal to the upper electrode 130 can be performed through the beam portion 133, the fixed portion 136, and the wiring portion 150 extending from the fixed portion 136. In addition, an electric signal obtained by the vibration of the upper electrode 130 can be extracted through the lower electrode 120, and the beam portion 133, the fixed portion 136, and the wiring portion 150 which extend from the upper electrode 130.

The upper electrode 130 as a movable electrode is attracted in a direction a of the lower electrode 120 by electrostatic attraction of charges generated in association with the application of a potential between the upper electrode 130 and the lower electrode 120. In addition, the upper electrode 130 is separated in a direction a' different from that of the lower electrode 120 by the release of the application of a potential. The curvature vibration operation of the upper electrode 130 can be performed by repeating the above-mentioned attraction and separation. In addition, a signal associated with the curvature vibration operation of the upper electrode 130 is output between each of the electrodes.

The vibration of the upper electrode 130 (movable electrode) is changed to a flexural vibration operation having portions in which a central portion where the lower electrode 120 and the upper electrode 130 overlap each other and both ends of the upper electrode 130 become antinodes of the vibration, and become nodes 131 of the vibration between the antinodes of the vibration. In other words, the vibration of the upper electrode 130 is changed to a curvature movement operation using the nodes 131 as a fulcrum.

In order to enable the above-mentioned curvature movement operation, the beam portion 133 is connected to the upper electrode 130 in the portion becoming the node 131 of the vibration. In other words, the beam portion 133 extends from the node 131 of the vibration of the upper electrode 130.

In the MEMS vibrator 2 of the embodiment shown in FIGS. 6A and 6B, a configuration in which a plurality of beam portions 133 extend from the upper electrode 130 has been described. Regarding the beam portion 133 that supports the upper electrode 130, it is preferable that two pairs (two sets) of beam portions 133 extend on both sides centered on the upper electrode 130 for each node 131 of the vibration shown in FIGS. 6A and 6B and be respectively connected to the fixed portions 136.

Meanwhile, the beam portions 133 may be provided in one direction from the node 131 of the vibration of the upper electrode 130, without being limited thereto. In addition, the beam portions 133 may be provided in an alternate direction from the upper electrode 130 for each node 131 of the vibration.

In addition, the beam portions 133 may extend from the node 131 of the vibration included in a point-symmetric position using a point (not shown) on a virtual line (for example, line B1-B1' shown in FIG. 6A) passing through the center of a direction (longitudinal direction) in which the upper electrode 130 stretches, as an axis.

In addition, the beam portions 133 may be provided to any of the nodes 131 of the vibration. That is, the upper electrode 130 may be supported by one beam portion 133.

Method of Manufacturing of MEMS Vibrator 2

Next, a method of manufacturing the MEMS vibrator 2 will be described.

FIGS. 8A to 10I are cross-sectional views illustrating the method of manufacturing the MEMS vibrator 2 according to the second embodiment in order of processes. Meanwhile, FIGS. 8A to 10I are diagrams schematically illustrating a cross-section of the MEMS vibrator 2 taken along line B1-B1' of FIG. 6A.

A process of manufacturing the MEMS vibrator 2 of the embodiment includes a process of preparing the substrate 110 having the principal surface 110a on which the insulating portion 112, the lower electrode 120, the upper electrode 130, and the like are formed.

In addition, the process of manufacturing the MEMS vibrator 2 includes a process of forming the insulating portion 112 on the principal surface 110a side of the substrate 110, and processes of forming the lower electrode 120, the conductive portion 135, the function portion 140, and the wiring portion 150 on the principal surface 112a of the insulating portion 112.

Further, the process of manufacturing the MEMS vibrator 2 includes a process of forming the upper electrode 130 at the distance 160 from the lower electrode 120.

Hereinafter, the method of manufacturing the MEMS vibrator 2 will be described in order of processes with reference to FIGS. 8A to 10I.

Process of Preparing of Substrate 110

FIG. 8A illustrates a state in which the substrate 110 having the MEMS vibrator 2 being formed thereon is prepared.

The process of preparing the substrate 110 is a process of preparing the substrate 110 on which the insulating portion 112, the lower electrode 120, the upper electrode 130, the conductive portion 135, the function portion 140, and the like are formed in each process described later. As the substrate 110, for example, a silicon substrate can be used. Meanwhile, in the description of the method of manufacturing the MEMS vibrator 2, one surface of the substrate 110 on the side where the insulating portion 112, the lower electrode 120, the upper electrode 130, the function portion 140, and the like are formed is also called the principal surface 110a.

Process of Forming of Insulating Portion 112

FIG. 8B illustrates a state in which the insulating portion 112 is formed on the principal surface 110a of the substrate 110.

The process of forming the insulating portion 112 is a process of laminating the insulating portion 112 on the principal surface 110a side of the substrate 110 prepared in the above-mentioned process.

The insulating portion 112 of the MEMS vibrator 2 according to the embodiment is constituted by the first insulating portion 1121 and the second insulating portion 1122 in this order from the principal surface 110a side of the substrate 110. Meanwhile, in the description of the method of manufacturing the MEMS vibrator 2, one surface of the insulating portion 112 on the side where the second insulating portion 1122 is formed is also called the principal surface 112a.

In a process of forming the first insulating portion 1121, for example, a silicon oxide ($SiO_2$) film can be formed as the first insulating portion 1121 by a CVD (chemical vapor deposition) method. The process of forming the first insulating portion 1121 is not limited to the CVD method, and a silicon oxide film may be formed on the principal surface 110a of a silicon substrate as the substrate 110 by a thermal oxidation method. Meanwhile, the first insulating portion 1121 corresponds to the principal surface 110a of the substrate 110, and is formed on substantially the entire surface thereof.

In a process of forming the second insulating portion 1122, for example, a silicon nitride ($Si_3N_4$) film as the second insulating portion 1122 can be formed by a CVD method. The process of forming the second insulating portion 1122 is not limited to the CVD method, and a silicon nitride film may be formed by heating a silicon substrate as the substrate 110 in the atmosphere of a nitrogen gas and a hydrogen gas.

Meanwhile, the second insulating portion 1122 corresponds to the first insulating portion 1121, and is formed on substantially the entire surface thereof.

Processes of Forming Lower Electrode 120, Conductive Portion 135, Function Portion 140 and Wiring Portion 150

Figure 8:
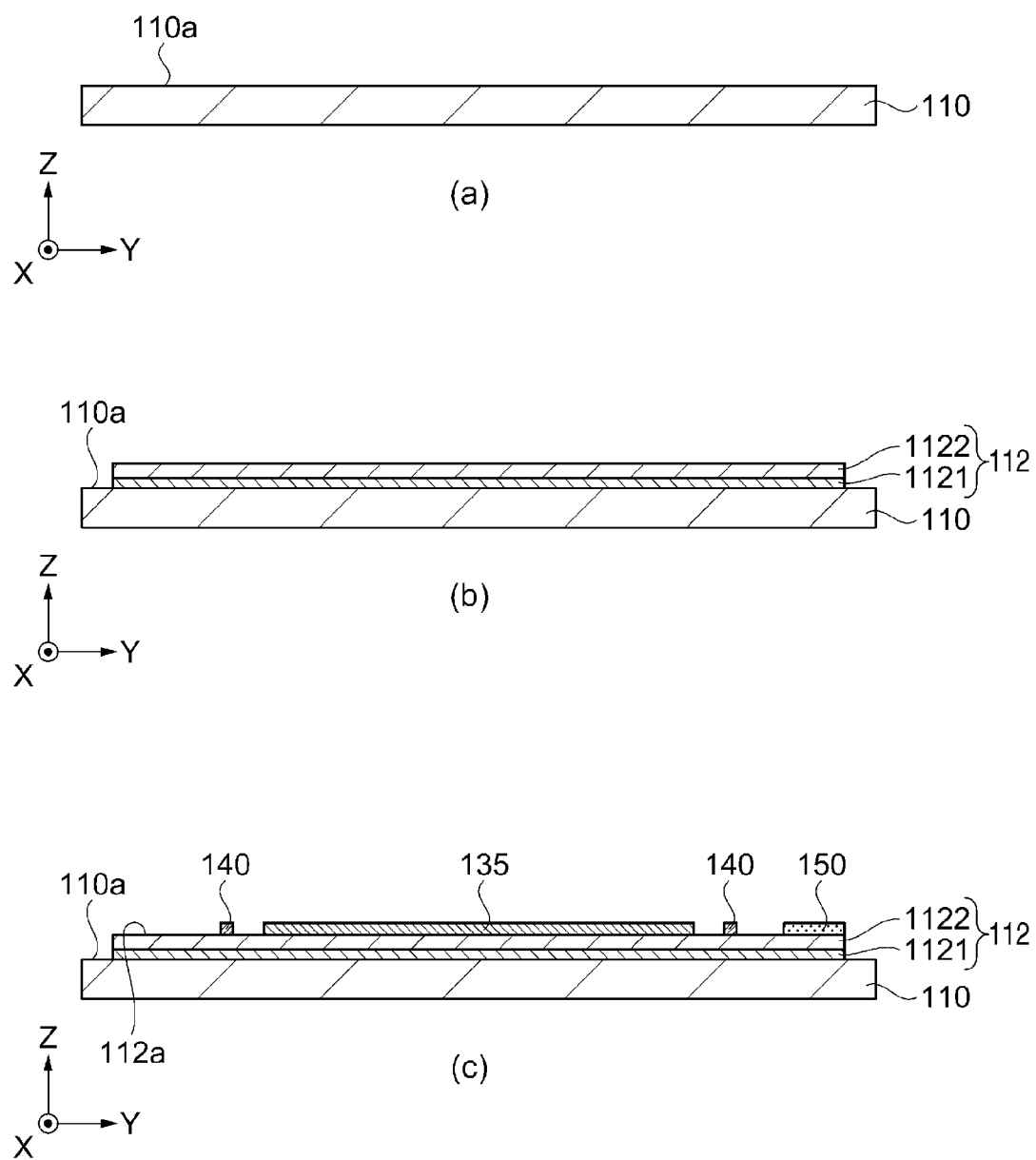
FIGS. 8A to 8C are cross-sectional views schematically illustrating a process of manufacturing the MEMS vibrator according to the second embodiment.
Figure 9:
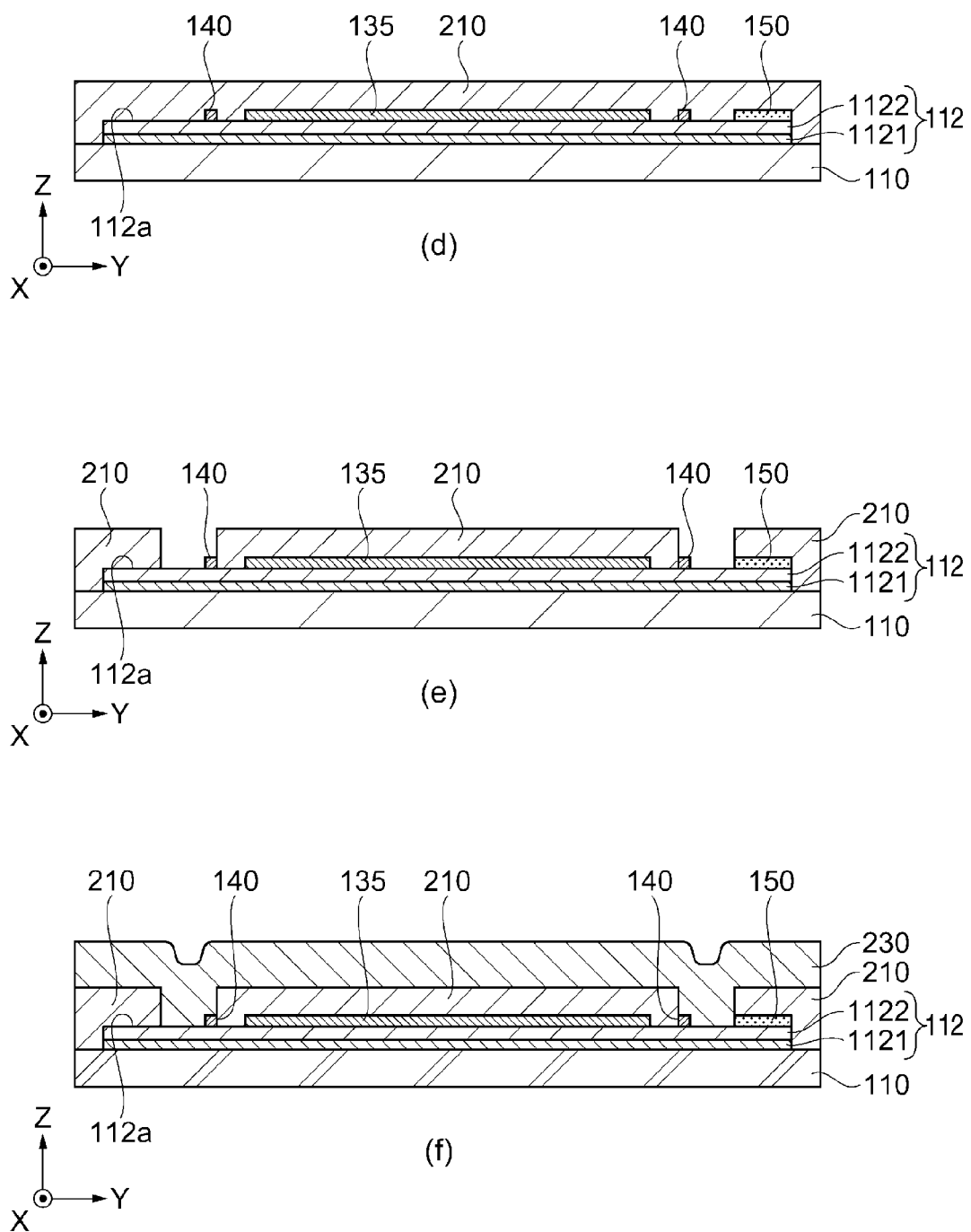
FIGS. 9D to 9F are cross-sectional views schematically illustrating a process of manufacturing the MEMS vibrator according to the second embodiment.
Figure 10:
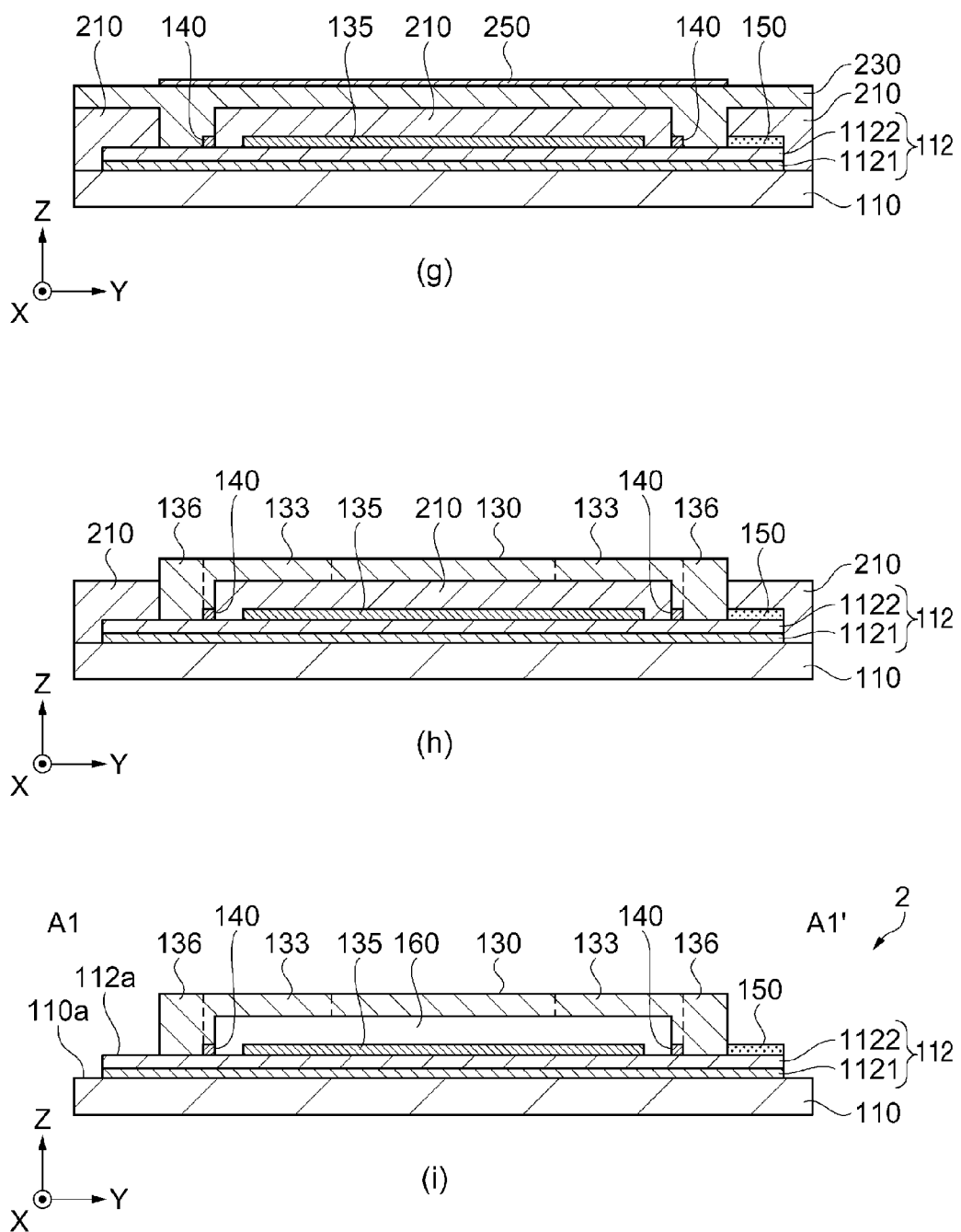
FIGS. 10G to 10I are cross-sectional views schematically illustrating a process of manufacturing the MEMS vibrator according to the second embodiment.

FIG. 8C illustrates a state in which the lower electrode 120 (not shown in FIGS. 8A to 10I), the conductive portion 135, the function portion 140, and the wiring portion 150 are formed on the principal surface 112a of the insulating portion 112.

The process of forming the lower electrode 120 is a process of forming the lower electrode 120 on the principal surface 112a side of the above-mentioned insulating portion 112, that is, the second insulating portion 122.

In the process of forming the lower electrode 120, for example, the lower electrode 120 containing conductive material such as polycrystalline silicon, amorphous silicon, gold (Au), and titanium (Ti) can be formed by a CVD method.

Meanwhile, in order to form the conductive portion 135 and the function portion 140 on the second insulating portion 1122 in processes described later in addition to the lower electrode 120, a mask is performed on a region located on the second insulating portion 1122 in which it is not desired to form the lower electrode 120, and the lower electrode 120 is formed.

A method of forming the lower electrode 120 is not limited to a CVD method, and the lower electrode 120 containing various types of conductive materials may be formed using a PVD (Physical Vapor Deposition) method or the like.

A process of forming the conductive portion 135 is a process of forming the conductive portion 135 on the principal surface 112a side of the above-mentioned insulating portion 112, that is, the second insulating portion 1122.

In the process of forming the conductive portion 135, for example, the conductive portion 135 containing polycrystalline silicon, amorphous silicon, gold (Au), titanium (Ti) and the like can be formed by a CVD method. In the process of forming the conductive portion 135, it is preferable to form the conductive portion 135 having a thickness substantially equal to that of the lower electrode 120. This is because the thickness of the sacrificial layer 210 formed on the lower electrode 120, the conductive portion 135 and the like described later is made uniform, and the unevenness of the upper electrode 130 formed on the sacrificial layer 210 is suppressed. Meanwhile, in order to form the above-mentioned lower electrode 120 on the second insulating portion 1122 in addition to the conductive portion 135, it is preferable that a mask be performed on a region located on the second insulating portion 1122 in which it is not desired to form the conductive portion 135, and the conductive portion 135 be formed. A method of forming the conductive portion 135 is not limited to a CVD method, and the conductive portion 135 containing various types of conductive materials may be formed using a PVD method or the like.

A process of forming the function portion 140 is a process of forming the function portion 140 on the principal surface 112a side of the above-mentioned insulating portion 112, that is, the second insulating portion 1122.

In the process of forming the function portion 140, for example, the function portion 140 containing polycrystalline silicon, amorphous silicon or the like can be formed by a CVD method. Meanwhile, since the above-mentioned lower electrode 120 or the conductive portion 135 is formed on the second insulating portion 1122 in addition to the function portion 140, it is preferable that a mask be performed on a region located on the second insulating portion 1122 in which it is not desired to form the function portion 140, and the function portion 140 be formed. A method of forming the function portion 140 is not limited to a CVD method, and the function portion 140 may be formed using a PVD method or the like.

A process of forming the wiring portion 150 is a process of forming the wiring portion 150 connected to the fixed portion 136.

In the process of forming the wiring portion 150, the wiring portion 150 containing conductive materials such as, for example, polycrystalline silicon, amorphous silicon, gold (Au), and titanium (Ti) can be formed on the principal surface 112a of the insulating portion 112 by a CVD method. Meanwhile, since the lower electrode 120, the conductive portion 135, and the function portion 140 mentioned above are formed on the second insulating portion 1122 in addition to the wiring portion 150, it is preferable that a mask be performed on a region located on the second insulating portion 1122 in which it is not desired to form the wiring portion 150, and the conductive portion 135 be formed. A method of forming the wiring portion 150 is not limited to a CVD method, and the wiring portion 150 may be formed using a PVD method or the like.

In each process of forming the lower electrode 120, the conductive portion 135, the function portion 140, and the wiring portion 150 mentioned above, the lower electrode 120, the conductive portion 135, the function portion 140, and the wiring portion 150 may be formed simultaneously by a CVD method or a PVD method, for example, by using the same material. The electrode and these portions are formed simultaneously, and thus it is possible to easily form the lower electrode 120 and the conductive portion 135 with the same thickness.

Process of Forming of Sacrificial Layer 210

FIG. 9D illustrates a state in which the sacrificial layer 210 is provided so as to cover the lower electrode 120, the conductive portion 135, and the function portion 140 in order to provide the distance 160 between the upper electrode 130, and the lower electrode 120 and the conductive portion 135.

The process of forming the sacrificial layer 210 is a process of forming the sacrificial layer 210 which is an intermediate layer for providing the above-mentioned distance 160.

As mentioned above, the MEMS vibrator 2 is provided with the upper electrode 130 at the distance 160 from the lower electrode 120 and the conductive portion 135. The upper electrode 130 is formed on the sacrificial layer 210 in a process described later, and the sacrificial layer 210 is removed by a post-process. Therefore, it is possible to provide the distance 160 between the upper electrode 130, and the lower electrode 120 and the conductive portion 135.

In the process of forming the sacrificial layer 210, for example, the sacrificial layer 210 containing a silicon oxide can be formed by a CVD method. The method of forming the sacrificial layer 210 is not limited to a CVD method, and the sacrificial layer 210 containing a silicon oxide may be formed using a PVD method or the like.

Meanwhile, as a material constituting the sacrificial layer 210, it is preferable to use a silicon oxide which is a material capable of selectively removing (etching) the sacrificial layer 210 or a compound containing the silicon oxide, in order to remove the sacrificial layer 210 while the lower electrode 120, the upper electrode 130, the function portion 140 and the like are left behind in a process described later. The material of the sacrificial layer 210 is not limited to a silicon oxide or a compound containing the silicon oxide, but may be appropriately changed insofar as a material capable of selectively removing the sacrificial layer 210 is used.

Process of Forming of Upper Electrode 130

FIG. 9E illustrates a state in which the sacrificial layer 210 corresponding to portions in which the insulating portion 112 and the fixed portion 136, and the function portion 140 and the beam portion 133 are connected to each other is partially removed.

In the process of forming the upper electrode 130, first, the sacrificial layer 210 is partially removed which is formed on the portion in which the insulating portion 112 and the fixed portion 136 are connected to each other and the portion in which the function portion 140 and the beam portion 133 are connected to each other.

The process of partially removing the sacrificial layer 210 is a process of removing the sacrificial layer 210 formed on the portion in which the insulating portion 112 and the fixed portion 136 are connected to each other and the portion in which the function portion 140 and the beam portion 133 are connected to each other, by a photolithographic method. In the process of removing the sacrificial layer 210, the sacrificial layer 210 is removed so that the insulating portion 112 connected to the fixed portion 136 and the function portion 140 connected to the beam portion 133 are exposed.

FIG. 9F illustrates a state in which a polycrystalline silicon layer 230 as the upper electrode 130, the beam portion 133, and the fixed portion 136 is formed on the sacrificial layer 210 located at the principal surface 112a side.

In the process of forming the upper electrode 130, the polycrystalline silicon layer 230 as the upper electrode 130, the beam portion 133, and the fixed portion 136 is next formed on the sacrificial layer 210. In a process of forming the polycrystalline silicon layer 230, the polycrystalline silicon layer 230 constituting the upper electrode 130, the beam portion 133, and the fixed portion 136 can be formed on the sacrificial layer 210 by, for example, a CVD method.

FIG. 10G illustrates a state in which the polycrystalline silicon layer 230 formed in the process of forming the upper electrode 130 is planarized, and a mask pattern 250 for forming (patterning) the upper electrode 130, the beam portion 133, and the fixed portion 136 is formed.

Next, in the process of forming the upper electrode 130, the polycrystalline silicon layer 230 formed in the previous process is planarized. In the polycrystalline silicon layer 230 formed in the previous process, since the sacrificial layer 210 such as a portion in which the fixed portion 136 and the insulating portion 112 are connected to each other is removed, a recess (see FIG. 9F) occurs in the portion. When a recess is included in the polycrystalline silicon layer 230 serving as the upper electrode 130, there is a concern of influencing the vibration characteristics of the MEMS vibrator 2, it is preferable to planarize the polycrystalline silicon layer 230. The planarization of the polycrystalline silicon layer 230 can be perform by, for example, a CMP (Chemical Mechanical Polishing) method.

Next, in the process of forming the upper electrode 130, the mask pattern 250 for removing the polycrystalline silicon layer 230 of unnecessary portions as the upper electrode 130, the beam portion 133, and the fixed portion 136 is formed. Next, the polycrystalline silicon layer 230 of portions in which the mask pattern 250 is not formed, that is, unnecessary portions as the upper electrode 130, the beam portion 133, and the fixed portion 136 is removed. The formation of the mask pattern 250 and the removal of the polycrystalline silicon layer 230 can be performed by a photolithographic method.

Meanwhile, FIG. 10H illustrates a state in which unnecessary portions as the upper electrode 130, the beam portion 133, and the fixed portion 136 are removed in the polycrystalline silicon layer 230 formed in the process of forming the above-mentioned upper electrode 130.

Process of Removing of Sacrificial Layer 210

FIG. 10I illustrates a state in which the sacrificial layer 210 formed in the previous process is removed.

The process of removing the sacrificial layer 210 is a process of removing the sacrificial layer 210 temporarily formed in order to provide the distance 160 between the lower electrode 120 and the conductive portion 135, and the upper electrode 130 and the beam portion 133.

The process of removing the sacrificial layer 210 is required to selectively remove the sacrificial layer 210. Consequently, in the process of removing the sacrificial layer 210, the sacrificial layer 210 is etched (removed) by, for example, a wet etching method. The removal of the sacrificial layer 210 by a wet etching method is preferable when an etchant (cleaning solution) containing a hydrofluoric acid is used. By using the etchant containing a hydrofluoric acid, the etching rate of the sacrificial layer 210 containing a silicon oxide is higher than the etching rate of the lower electrode 120 and the upper electrode 130, and thus the sacrificial layer 210 can be selectively and efficiently removed.

In addition, the second insulating portion 1122 can function as a so-called etching stopper by containing a silicon nitride having hydrofluoric acid resistance in the second insulating portion 1122 which is an underlying film of the lower electrode 120, the conductive portion 135, the function portion 140, and the wiring portion 150. Thereby, in the MEMS vibrator 2, it is possible to suppress a reduction in insulation between the substrate 110 by the etching of the sacrificial layer 210, and the lower electrode 120, the conductive portion 135, the function portion 140, and the wiring portion 150.

Meanwhile, the process of removing the sacrificial layer 210 is not limited to a wet etching method, but may be performed by a dry etching method.

In the MEMS vibrator 2, the distance 160 occurs between the lower electrode 120 and the conductive portion 135, and the upper electrode 130 and the beam portion 133 by removal of the sacrificial layer 210, and thus the upper electrode 130 can vibrate.

The process of manufacturing the MEMS vibrator 2 is completed by removing the above-mentioned sacrificial layer 210.

According to the above-mentioned second embodiment, the following effects are obtained.

According to such a MEMS vibrator, the vibration leaking from the upper electrode 130 to the beam portion 133 is refracted in the function portion 140 which comes into contact with the beam portion 133, and the leakage of the vibration to the fixed portion 136 is suppressed. Thus, distortion occurring between the beam portion 133 and the fixed portion 136 and between the fixed portion 136 and the insulating portion 112 due to the vibration leaking from the upper electrode 130 is suppressed. Therefore, it is possible to suppress a shift in the vibration frequency of the upper electrode 130 occurring from the distortion and a reduction in the Q value of the MEMS vibrator 2.

Example

Next, an example in which any of the MEMS vibrator 1 and the MEMS vibrator 2 (hereinafter, described as the MEMS vibrator 1 collectively) according to the embodiments of the invention is applied will be described with reference to FIGS. 11 to 14.

Electronic Device

First, electronic devices to which the MEMS vibrator 1 according to the embodiment of the invention is applied will be described with reference to FIGS. 11 to 13.

Figure 11:
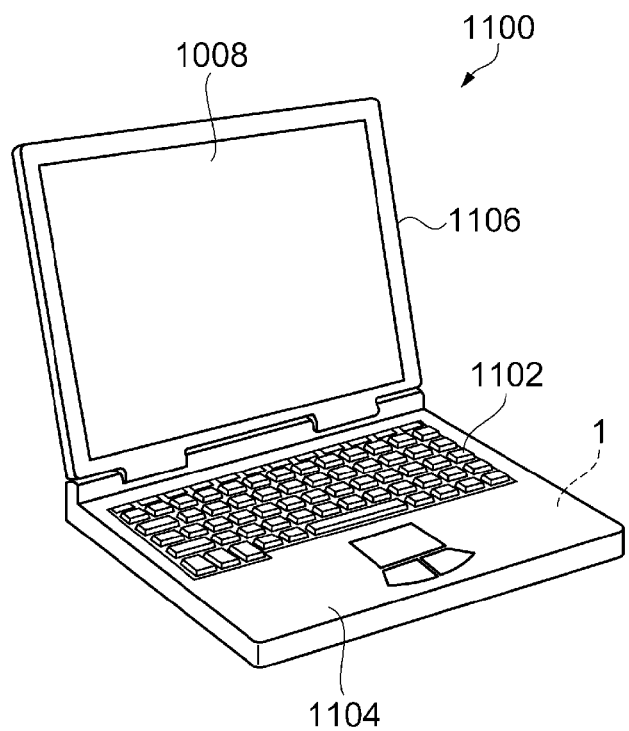
FIG. 11 is a diagram schematically illustrating a personal computer as an electronic device according to an example.

FIG. 11 is a perspective view illustrating an outline of a configuration of a notebook-type (or mobile-type) personal computer as an electronic device including the MEMS vibrator according to the embodiment of the invention. In the drawing, a notebook-type personal computer 1100 is constituted by a main body 1104 including a keyboard 1102 and a display unit 1106 including a display portion 1008, and the display unit 1106 is rotatably supported with respect to the main body 1104 through a hinge structure. Such a notebook-type personal computer 1100 has the MEMS vibrator 1 built-in which functions as an acceleration sensor or the like for detecting acceleration or the like applied to the notebook-type personal computer 1100 to display the acceleration or the like on the display unit 1106.

Figure 12:
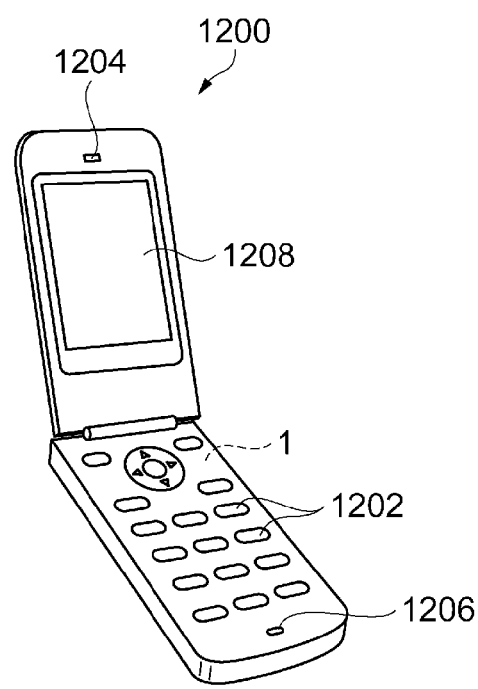
FIG. 12 is a diagram schematically illustrating a cellular phone as an electronic device according to the example.

FIG. 12 is a perspective view illustrating an outline of a configuration of a cellular phone (also including PHS) as an electronic device including the MEMS vibrator according to the embodiment of the invention. In the drawing, a cellular phone 1200 includes a plurality of operation buttons 1202, an ear piece 1204 and a mouth piece 1206, and a display portion 1208 is disposed between the operation buttons 1202 and the ear piece 1204. Such a cellular phone 1200 has the MEMS vibrator 1 built-in which functions as an acceleration sensor or the like for detecting acceleration or the like applied to the cellular phone 1200 to assist an operation of the cellular phone 1200.

Figure 13:
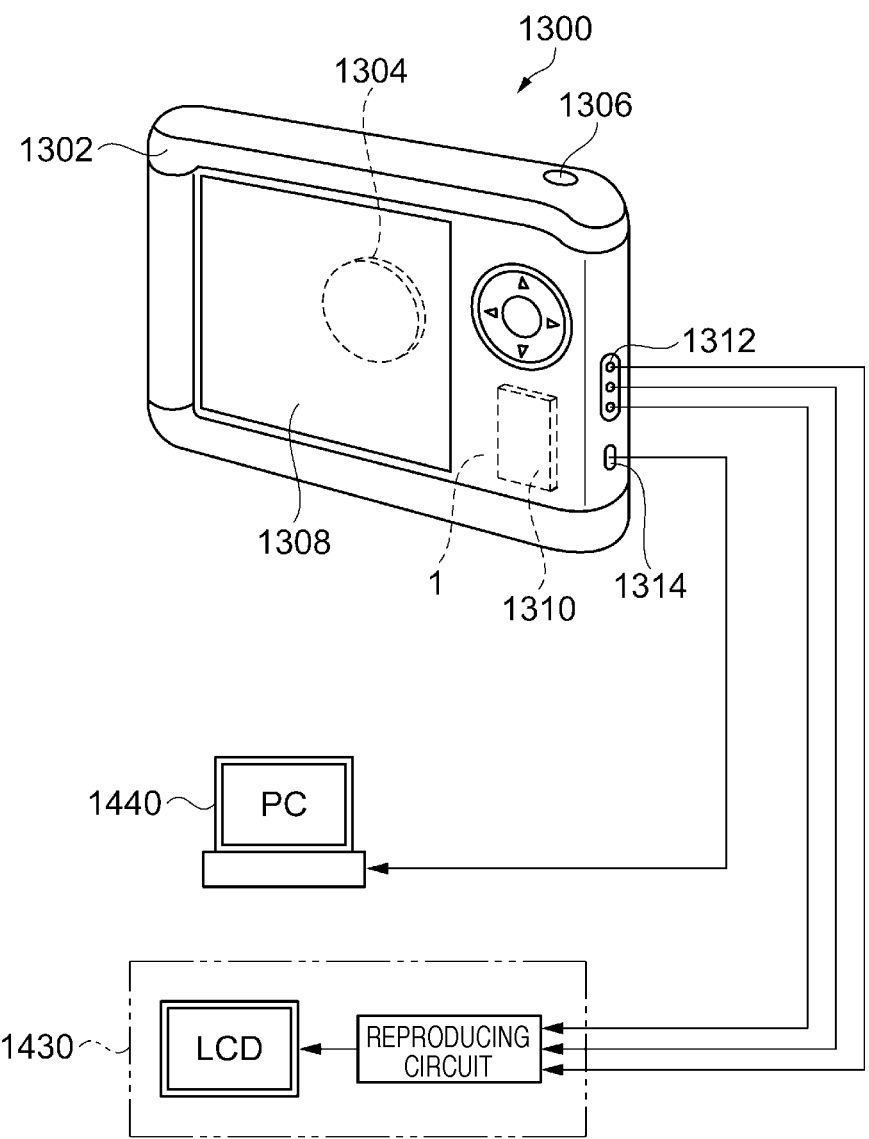
FIG. 13 is a diagram schematically illustrating a digital still camera as an electronic device according to the example.

FIG. 13 is a perspective view illustrating an outline of a configuration of a digital still camera as an electronic device including the MEMS vibrator according to the embodiment of the invention. Meanwhile, in the drawing, the connection with an external device is also shown simply. Here, a normal camera exposes a silver halide photo film through a light image of a subject, whereas a digital still camera 1300 generates an imaging signal (image signal) by photoelectrically converting a light image of a subject using an imaging device such as a CCD (Charge Coupled Device).

A display portion 1308 is provided on the rear of a case (body) 1302 in the digital still camera 1300, and is configured to perform a display on the basis of an imaging signal of a CCD. The display portion 1308 functions as a viewfinder for displaying a subject as an electronic image. In addition, a light-receiving unit 1304 including an optical lens (imaging optical system), a CCD and the like is provided on the front side (back side in the drawing) of the case 1302.

When a photographer confirms a subject image displayed on the display portion 1308 and pushes a shutter button 1306, an imaging signal of the CCD at that point in time is transmitted and stored to and in a memory 1310. In addition, in the digital still camera 1300, a video signal output terminal 1312 and an input and output terminal 1314 for data communication are provided on the lateral side of the case 1302. As shown in the drawing, a liquid crystal display 1430 is connected to the video signal output terminal 1312 and a personal computer 1440 is connected to the input and output terminal 1314 for data communication, respectively as necessary. Further, the imaging signal stored in the memory 1310 is output to a liquid crystal display 1430 or a personal computer 1440 by a predetermined operation. Such a digital still camera 1300 has the MEMS vibrator 1 built-in which functions as an acceleration sensor for detecting acceleration of falling in order to cause a function of protecting the digital still camera 1300 from the falling thereof to work.

Meanwhile, in addition to the personal computer (mobile-type personal computer) of FIG. 11, the cellular phone of FIG. 12, and the digital still camera of FIG. 13, the MEMS vibrator 1 according to the embodiment of the invention can be applied to, electronic devices such as, for example, an ink jet ejecting apparatus (for example, ink jet printer), a television, a video camera, a video tape recorder, a car navigation device, a pager, an electronic notebook (also including a communication function), an electronic dictionary, an electronic calculator, an electronic game console, a word processor, a workstation, a TV phone, a security TV monitor, an electronic binoculars, a POS terminal, medical instrument (for example, electronic thermometer, sphygmomanometer, blood glucose monitoring system, electrocardiogram measurement device, ultrasound diagnostic device, and electronic endoscope), a fish finder, various types of measuring apparatus, meters and gauges (for example, meters and gauges of a vehicle, an aircraft, and a vessel), and a flight simulator.

Moving Object

Figure 14:
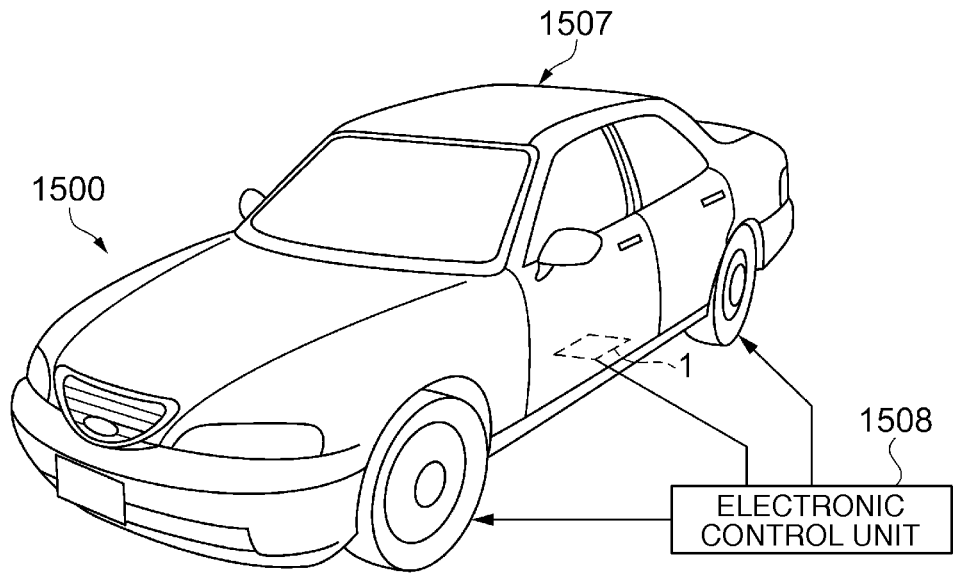
FIG. 14 is a diagram schematically illustrating an automobile as a moving object according to the example.

Next, FIG. 14 is a perspective view schematically illustrating an automobile as an example of a moving object. An automobile 1500 includes the MEMS vibrator 1 according to the invention. For example, as shown in the drawing, the automobile 1500 as the moving object has the MEMS vibrator 1 built-in that detects acceleration of the automobile 1500 and an electronic control unit (ECU) 1508 that controls an output of an engine is mounted to a car body 1507. The automobile 1500 as an efficient moving object in which the consumption of fuel or the like is suppressed can be obtained by detecting acceleration and controlling the engine with a proper output depending on the posture of the car body 1507.

In addition, the MEMS vibrator 1 can be applied widely to a car-body posture control unit, an antilock brake system (ABS), an air bag, and a tire pressure monitoring system (TPMS) other than the above.

The entire disclosure of Japanese Patent Application No. 2013-040408, filed Mar. 1, 2013 is expressly incorporated by reference herein.

What is claimed is:

1. A MEMS vibrator comprising:
   an insulating layer;
   a fixed electrode that is provided on the insulating layer;
   a movable electrode that is provided over the insulating layer, part of the movable electrode being overlapped with the fixed electrode in a plan view so that the movable electrode is spaced apart from the fixed electrode;
   a beam that extends from the movable electrode over the insulating layer so that the beam is spaced apart from the insulating layer in the plan view;
   a fixing member that is provided on the insulating layer and that is continuously formed with the beam; and
   a vibration suppression member that is provided on the insulating layer and that is continuously formed with the beam and the fixing member so that the vibration suppression member prevents vibration from being transmitted from the movable electrode to the fixing member via the beam, wherein
   the fixed electrode is shifted from the beam in the plan view.

2. An electronic device to which the MEMS vibrator according to claim 1 is mounted.

3. A moving object to which the MEMS vibrator according to claim 1 is mounted.

* * * * *